(12) United States Patent
Govorkov et al.

(10) Patent No.: US 8,170,073 B2
(45) Date of Patent: May 1, 2012

(54) OPTICALLY-PUMPED EXTERNAL-CAVITY SURFACE-EMITTING SEMICONDUCTOR LASERS WITH FRONT-COOLED GAIN-STRUCTURES

(75) Inventors: Sergei V. Govorkov, Los Altos, CA (US); R. Russel Austin, Cool, CA (US)

(73) Assignee: Coherent, Inc., Santa Clara, CA (US)

( * ) Notice: Subject to any disclaimer, the term of this patent is extended or adjusted under 35 U.S.C. 154(b) by 0 days.

(21) Appl. No.: 12/558,315

(22) Filed: Sep. 11, 2009

(65) Prior Publication Data
US 2011/0064099 A1 Mar. 17, 2011

(51) Int. Cl.
*H01S 3/04* (2006.01)

(52) U.S. Cl. ............ 372/36; 372/34; 372/43.01; 372/93; 372/94

(58) Field of Classification Search ............... 372/34–36, 372/43.01
See application file for complete search history.

(56) References Cited

U.S. PATENT DOCUMENTS

| | | | |
|---|---|---|---|
| 5,436,920 A | 7/1995 | Minemoto et al. | |
| 5,627,853 A | 5/1997 | Mooradian et al. | |
| 6,782,019 B2 | 8/2004 | Zheng | |
| 6,822,988 B1 * | 11/2004 | Okazaki et al. | 372/38.06 |
| 6,940,880 B2 * | 9/2005 | Butterworth et al. | 372/22 |
| 7,397,829 B2 * | 7/2008 | Yoo et al. | 372/22 |
| 2005/0190810 A1 * | 9/2005 | Butterworth et al. | 372/70 |
| 2005/0276301 A1 * | 12/2005 | Spinelli et al. | 372/72 |
| 2006/0280220 A1 * | 12/2006 | Yoo | 372/99 |
| 2007/0110118 A1 * | 5/2007 | Kim et al. | 372/99 |
| 2007/0291801 A1 * | 12/2007 | Caprara et al. | 372/22 |
| 2008/0112443 A1 * | 5/2008 | Lee et al. | 372/22 |
| 2009/0067453 A1 * | 3/2009 | Mizuuchi et al. | 372/6 |

OTHER PUBLICATIONS

J.-M. Hopkins et al., "High-power, (AlGaIn)(AsSb) semiconductor disk laser at 2.0μm," *Optics Letters*, vol. 33, No. 2, Jan. 15, 2008, pp. 201-203.
J.E. Hastie et al., "High power CW red VECSEL with linearly polarized $TEM_{00}$ output beam," *Optics Express*, vol. 13, No. 1, Jan. 10, 2005, pp. 77-81.

* cited by examiner

*Primary Examiner* — Tod T Van Roy
*Assistant Examiner* — Delma R Forde
(74) *Attorney, Agent, or Firm* — Morrison & Foerster LLP

(57) ABSTRACT

A semiconductor gain-structure functions as a gain-element in a laser-resonator. The gain-structure is bonded to a diamond heat-spreader that is peripherally cooled by a heat-sink configured to allow access to the gain-structure by laser-radiation circulating in the laser-resonator. In one example, the gain-structure is used as a transmissive gain-structure in a traveling-wave ring-resonator. In another example, the gain-structure surmounts mirror-structure which functions as an end-mirror of a standing-wave laser-resonator.

6 Claims, 7 Drawing Sheets

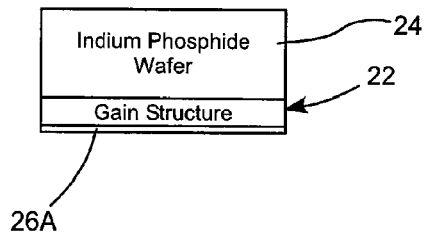
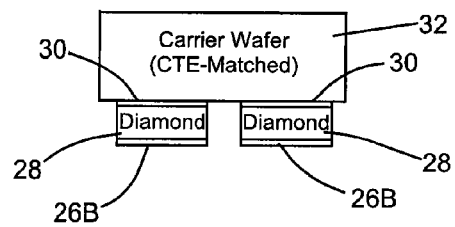
FIG. 3A            FIG. 3B
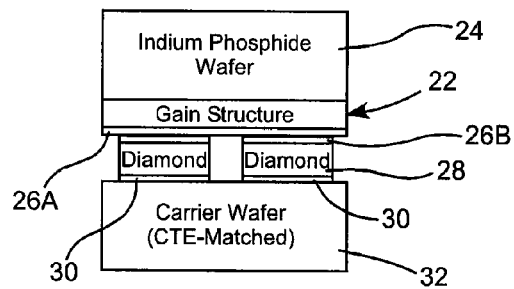
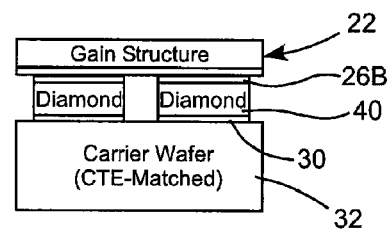
FIG. 3C            FIG. 3D
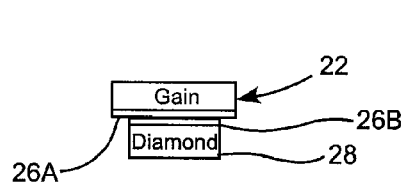
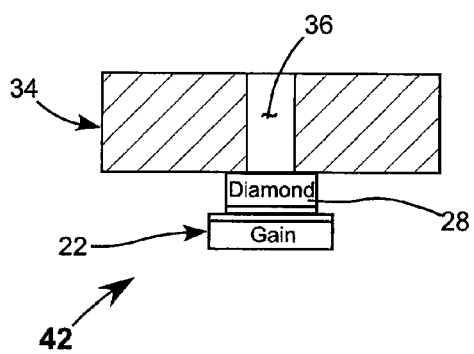
FIG. 3E            FIG. 3F

OPTICALLY-PUMPED EXTERNAL-CAVITY SURFACE-EMITTING SEMICONDUCTOR LASERS WITH FRONT-COOLED GAIN-STRUCTURES

TECHNICAL FIELD OF THE INVENTION

The present invention relates in general to optically pumped semiconductor lasers. The invention relates in particular to external-cavity surface-emitting semiconductor lasers.

DISCUSSION OF BACKGROUND ART

Optically pumped external cavity semiconductor lasers (OPS-lasers) are finding favor for diverse applications such as forensic science, video displays, optical inspection, and optically pumping fiber lasers. One advantage of such a laser is that the emitting wavelength thereof is arbitrarily selectable over a broad range of wavelengths through the visible portion of the electromagnetic spectrum into the infrared portion of the electromagnetic spectrum. Another advantage of such a laser is that it is relatively straightforward to operate in a single longitudinal mode to provide a very high quality output beam.

A fundamental component of an OPS-laser is what is commonly termed an OPS-chip or OPS-structure. One preferred OPS-structure includes an epitaxially-grown multilayer mirror-structure surmounted by an epitaxially-grown semiconductor gain-structure. After the mirror-structure and gain-structure are grown, the growth substrate is etched away and the chip is bonded mirror-side down to heat-sink substrate, usually a relatively massive copper block. A diamond-heat-spreader is typically located between the mirror-structure and the copper block.

An OPS-laser-resonator is usually formed between the mirror-structure of the OPS-chip and a separate conventional mirror axially spaced-apart from the chip. The power output of the resonator is typically limited by the ability of the diamond spreader and copper block to remove heat from the chip. This heat is generated by power absorbed in the gain-structure that is not extracted as laser radiation. The mirror-structure impedes the extraction of that heat. As pump power is increased, output-power of the resonator rises until heat can no longer be effectively removed at which point power output drops dramatically due to free-carrier absorption by the gain-structure. This is called "thermal roll-off" by practitioners of the art.

Regarding epitaxially grown mirror-structures, structures formed from alternating layers of gallium arsenide (GaAs) and aluminum arsenide (AlAs), fortunately, can provide high reflectivity and reasonable thermal conductivity at wavelengths between about 800 nm and 1100 nm. Such structures, of course are grown on a GaAs substrate. No other semiconductor system, for example indium phosphide InP and gallium antimonide (GaSb), which would be used for longer wavelength operation offers such a fortunate combination. Coupled with this the problem presented by the mirror-structure impeding heat extraction, is the fact that the heat impedance of a mirror structure increases with increasing wavelength. This is because quarter-wave optical thickness layers of the mirror-structure become physically thicker with increasing wavelength. Further, the efficiency of OPS-gain-structures decreases with increasing wavelength.

In theory at least, the power limitations of a single OPS-chip can be overcome by including two or more OPS-chips in a resonator either in a folded standing-wave resonator or in a traveling wave ring-resonator. One impediment to effecting this in practice is that an OPS-chip can deform during operation due to differential coefficients of expansion of the chip materials and heat-removal components. Deformation of one OPS-chip can deflect the lasing mode in the resonator such that the mode becomes misaligned with the pump-radiation on a second OPS-chip. Because of this it will usually be found that the maximum power available using N identical OPS-chips in a resonator is somewhat less that N times the power obtainable with one such OPS-chip in a resonator.

Another factor limiting the power multiplication is that in a typical resonator arrangement for accommodating multiple OPS-chips, no more than two such chips may be used with circulating fundamental incident thereon at normal incidence. An OPS-chip used at non-normal incidence can be somewhat less efficient than a chip used at non normal incidence due to laterally distributed interference effects in the gain-structure. There is a need to overcome these disadvantages of current OPS-chips.

SUMMARY OF THE INVENTION

In one aspect of the present invention, laser apparatus comprises a laser-resonator formed by a plurality of resonator mirrors. Located in the laser-resonator is an epitaxially grown semiconductor multilayer gain-structure. The gain-structure has first and second surfaces and includes a plurality of active layers spaced apart by barrier layers. A diamond heat-spreader has first and second opposite surfaces with the first surface of the diamond heat-spreader bonded to the second surface of the gain-structure. An arrangement is provided for delivering optical pump-radiation having a pump-radiation wavelength to the gain-structure such that a portion of the pump-radiation energizes the gain-structure and generates fundamental-wavelength laser-radiation which circulates in the laser-resonator, with a residual portion of the pump-radiation being converted to heat in the gain-structure. A heat-sink member is in thermal contact only with the second surface of the diamond heat-spreader. The heat sink member is configured such that heat is removed from the gain-structure only via the second surface of the gain-structure and the diamond heat-spreader, while allowing access to the energized gain-structure by the laser radiation circulating in the laser-resonator. There is no arrangement for extracting heat from the gain-structure via the first surface thereof.

In one embodiment of the inventive apparatus the laser-resonator is a standing-wave laser-resonator, the first surface of the gain-structure surmounts a mirror-structure reflective at the fundamental wavelength and the mirror-structure provides an end-mirror of the laser-resonator. By configuring the mirror to be transparent at the pump-radiation wavelength, the pump-radiation can be delivered from outside of the laser-resonator though the mirror-structure to the gain-structure.

In another embodiment of the inventive apparatus, the laser-resonator is a traveling-wave ring resonator and the gain-structure is configured as a transmissive gain element. Another such transmissive gain-element can be added to provide greater power of the circulating radiation. Other embodiments of the invention will be evident to those skilled in the art from the detailed description set forth below.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

FIGS. 3A-F schematically illustrate steps of a preferred method of fabricating another front-surface-cooled, OPS-structure in accordance with the present invention, similar to the structure of FIG. 1F but wherein the mirror-structure is omitted.

DETAILED DESCRIPTION OF THE INVENTION

Figure 1A:
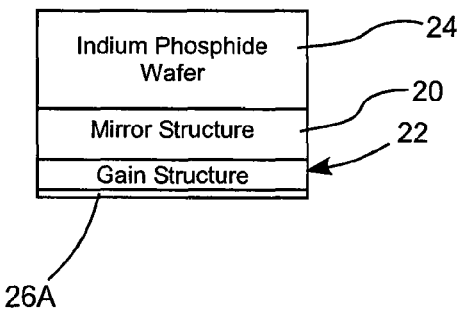
FIGS. 1A-F schematically illustrate steps in a preferred method of fabricating one preferred embodiment of a front-surface-cooled, OPS-structure in accordance with the present invention, the OPS-structure having a mirror-structure surmounted by a gain-structure, with the gain-structure having a diamond heat-spreader bonded thereto.

Referring now to the drawings, wherein like components are designated by like reference numerals, FIGS. 1A-F schematically illustrate steps in one preferred method of fabricating a front-cooled OPS structure in accordance with the present invention. FIG. 1A depicts a mirror-structure 20 and a multilayer semiconductor gain-structure 22 epitaxially grown on an indium phosphide wafer 24.

Figure 1B:
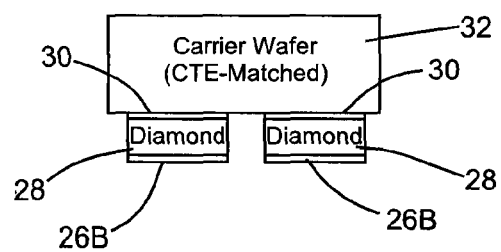
Figure 1C:
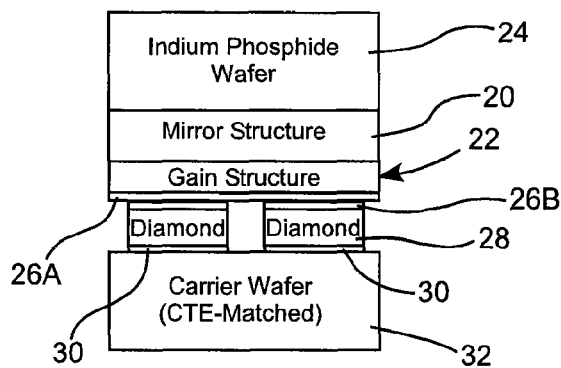
Figure 1D:
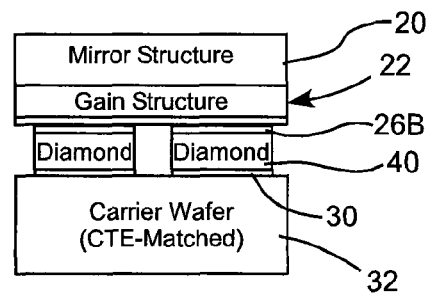
Figure 1E:
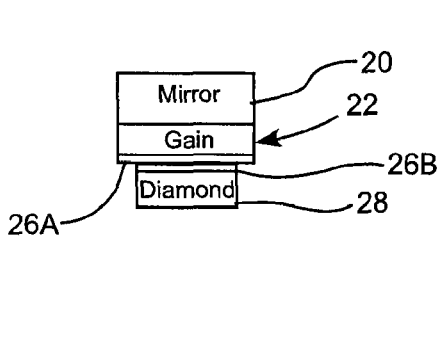

FIG. 1B depicts a plurality of diamond heat-spreader chips 28 bonded by layers 30 of a temporary adhesive such as a water soluble adhesive to a carrier wafer or substrate 32 of a material preferably ate least approximately coefficient-of-thermal-expansion-matched (CTE-matched) to diamond, for example, silicon or silicon carbide. One suitable adhesive is Aquabond55™, available from Aquabond Technologies Inc., of Camarillo, Calif. The diamond chips should have about equal thickness and un-bonded surfaces can be leveled by pressure applied by a reference flat surface before the adhesive sets.

An amorphous layer 26A of a material transparent to the peak-gain wavelength of gain-structure 22 is deposited on gain-structure 22 (see FIG. 1A). A layer 26B, preferably of the same material, is deposited on un-bonded surfaces of diamond heat-spreaders 28. Suitable materials for layers 26A and 26B are amorphous silicon and silicon dioxide. Each of these layers should be somewhat thicker than the greatest surface irregularity of the surface on which the layer is deposited. One preferred thickness is about 10 nanometers (nm). Surface irregularities due to defects in epitaxial growth will typically be found on gain-structure 22. Surface irregularities on the diamond heat-spreaders will result from the crystalline nature of the diamond.

Immediately after layers 26A and 26B have been deposited, the layers will reproduce the surface irregularities to some extent. The layers are then polished to smooth out the reproduced irregularities. Once smooth, flat surfaces have been obtained, the diamond heat-spreaders, still temporarily attached to carrier 32, are optical-contact bonded (direct bonded) to the gain-structure (see FIG. 1C). Once the contact bond has been formed, the indium phosphide wafer 24 is etched away leaving the mirror and gain-structures as a continuous pair of layers supported by the diamond heat-spreaders attached to carrier 32 (see FIG. 1D). The continuous layer of gain-structure and mirror-structure is then diced into chips of about the size of heat-spreader chips 28 and the temporary adhesive layer 30 dissolved to release the chips and spreaders 28 optical-contact bonded thereto (see FIG. 1E). A doughnut-shaped copper heat-sink 34 is then soldered onto the diamond heat-spreader of each chip (see FIG. 1F). An aperture 36 extending through the heat sink allows access for radiation circulating in a laser-resonator to access the gain-structure and the mirror-structure. The bonded assembly of FIG. 1F is designated hereinafter as a reflective OPS gain-module 40.

Optical contact bonding of the diamond spreader to the gain-structure is a preferred method because it offers the least thermal impedance and is usually an ambient temperature operation. Those skilled in the art, however, will recognize that it is not necessarily method that will provide 100% yield or offer the strongest bond. The actual yield and bond-strength can depend on the skill of a particular practitioner and on the ability to achieve a suitably smooth surface.

Several variations of the method have been described in the prior-art including bonding under vacuum and liquid capillary bonding. A smooth surface on the diamond may be obtainable by replicating a polished surface on some other material. The possibility of bonding using a transparent adhesive in a sufficiently thin layer can not be ruled out. The layer thickness should preferably less than about 100 nm. These and any other method of forming a transparent bond may be used to form the inventive front-cooled gain-module without departing from the sprit and scope of the present invention.

Figure 1F:
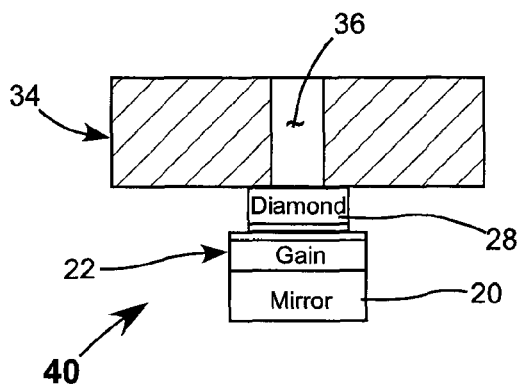
Figure 2:
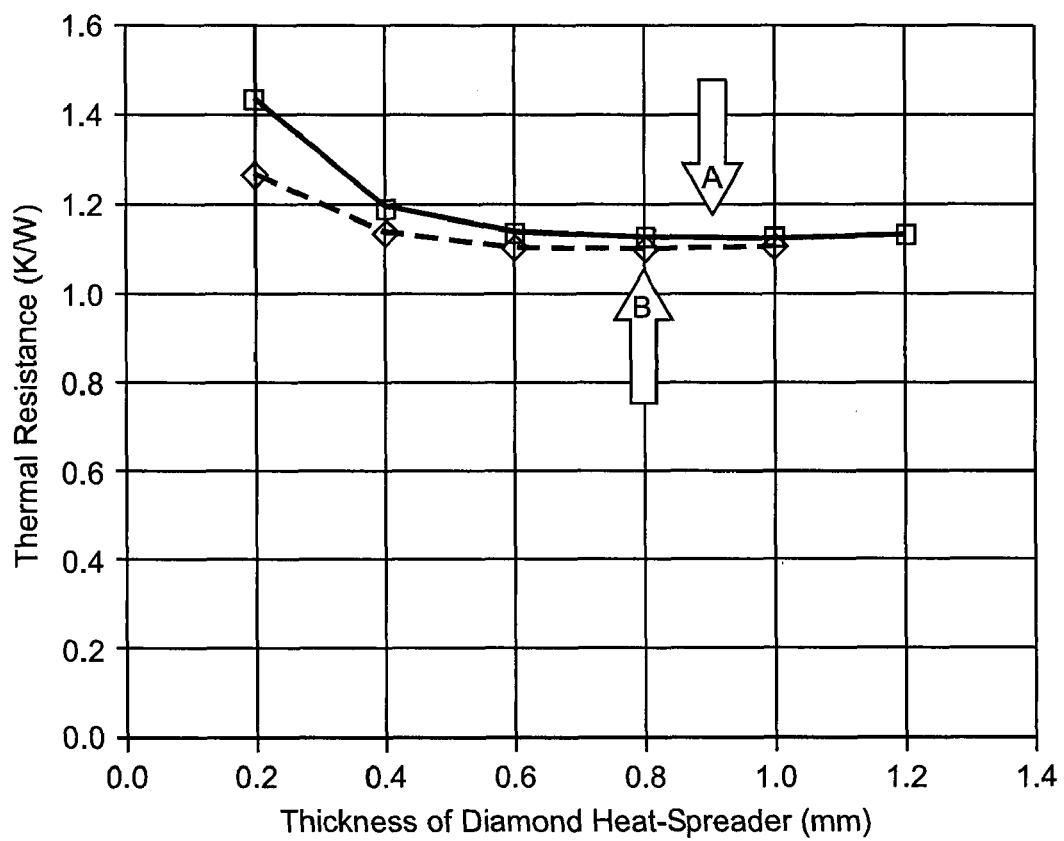
FIG. 2 is a graph schematically illustrating thermal resistance as a function of diamond heat-spreader thickness for one example of a front surface cooled OPS-structure of FIG. 1F compared with the same OPS-structure conventionally rear-surface cooled.

FIG. 2 is a graph, generated by finite element analysis, schematically illustrating thermal resistance as a function of thickness of a diamond heat-spreader for one example of gain module 40 of FIG. 1F (solid curve), with the thermal resistance as a function of thickness of a comparable prior-art, rear-surface, diamond-on-copper cooled semiconductor gain-structure (dashed curve) depicted for comparison. A finite element cell size of 0.050 mm was used in the calculation. In each case, it is assumed that diamond heat-spreader 28 has dimensions 3.0 mm×3.0 mm with variable thickness on the x-axis. In each case it is assumed that the copper heat-sink has overall dimensions of 6.0 mm×6.0 mm×6.0 mm with a centrally located aperture diameter of 1.0 mm in the case of the inventive arrangement only. It is assumed in each case that pump-radiation is directed into gain-structure 22 through the diamond heat-spreader.

It should be noted here that for optimum performance the thickness of diamond heat-spreader 28 should not simply be arbitrarily selected but should be optimized for any particular structure. It was found that there is a different optimum diamond thickness (for providing the lowest thermal resistance) in each case considered in the comparison of FIG. 2. The optimum thicknesses for the prior-art and inventive cases are indicated in FIG. 2 by arrows B and A respectively. The minimum thermal resistance for the inventive case is only about 2% greater than that for the prior-art case.

FIGS. 3A-F schematically illustrate steps of a preferred method of fabricating another front-surface-cooled, OPS-structure 42 in accordance with the present invention, similar to the structure of FIG. 1F but wherein the mirror-structure is omitted. In the first step (see FIG. 3A), only gain-structure 22 is epitaxially grown on semiconductor wafer 24. The remaining steps follow in the same sequence as for gain-module 40. Module 42 is a through structure (transmissive gain-module) which has very advantageous application described further hereinbelow. It is also possible in the method of FIG. 3 to deposit a mirror-structure on gain-structure 22 after steps 3D, 3E or 3F, such that the completed module is a reflective gain-module 40. This provides that the mirror-structure of the module may be formed with dielectric layer reflectors or dielectric-layer-enhanced metal layer reflector.

Figure 4:
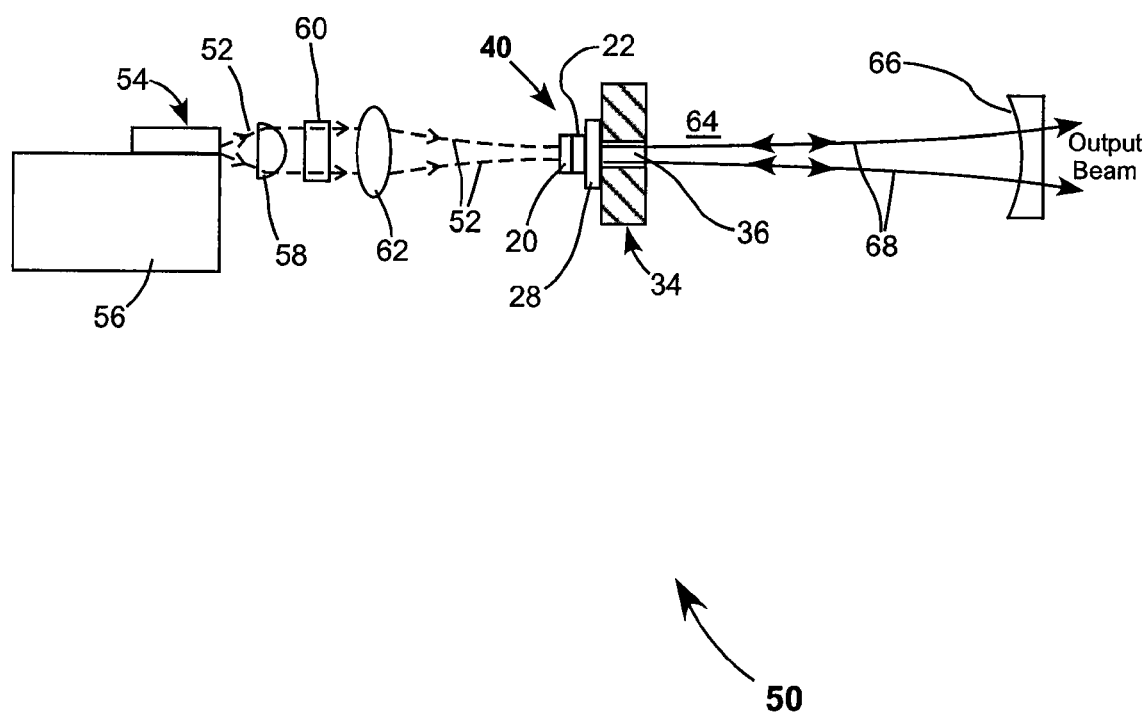
FIG. 4 schematically illustrates one preferred embodiment 50 of an OPS-laser having a standing-wave resonator including a front-surface cooled reflective gain-module in accordance with the present invention.

FIG. 4 schematically illustrates one preferred embodiment 50 of an OPS-laser including a front-surface cooled reflective gain-module 40 in accordance with the present invention. Laser 50 is optically pumped by radiation 52 from a diode-laser array 54 supported on a heat-sink 56. The radiation is collimated by a fast-axis cylindrical collimating lens 58 and a slow-axis cylindrical lens array 60. The collimated radiation is focused by a lens 62.

A standing-wave laser-resonator 64 is formed between mirror-structure 20 of the gain module and a partially transmissive concave mirror 66. Laser radiation circulates in the resonator in a mode 68 in response to the optical pumping. Aperture 36 in heat sink 34 preferably has a diameter only sufficient to accommodate lasing mode 68 without intercepting any portion of the mode. The mode-diameter is dependent, inter-alia, on the optical length of the resonator formed between mirror-structure 20 and mirror 66.

An advantage of the combination of OPS-structure 40 with diamond heat-spreader 28 and heat-sink 34 is that the mirror-structure does not provide thermal resistance to transfer of heat from the gain-structure to a heat sink as is the case in prior-art OPS-chips arranged to generate NIR radiation. This means that the mirror may be constructed purely to provide desired optical properties without regard to thermal properties of the materials. The materials of the mirror-structure must, of course, be transparent to pump-radiation 52. The mirror-structure may be a multilayer structure of dielectric or semiconductor layers configured as a short-wavelength-pass (short-pass) filter or a band-pass filter transmissive at the wavelength of the pump-radiation and maximally reflective at the peak-gain wavelength of the gain-structure.

While a gain-module 40 can be used with gain-structures providing peak-gain at any wavelength for which suitable semiconductor materials area available, such a module is particularly useful for use at mid infrared (mid IR) wavelengths at which the thickness of mirror-structures and the thermal conductivity shortcomings of mirror materials would be problematic for a conventional rear-cooled OPS-chip. Regardless of wavelength, however, the arrangement of laser 50 can be used to provide a compact resonator wherein the short length of the resonator makes it impractical to deliver pump-radiation for the gain-structure side of an OPS-chip.

Figure 5:
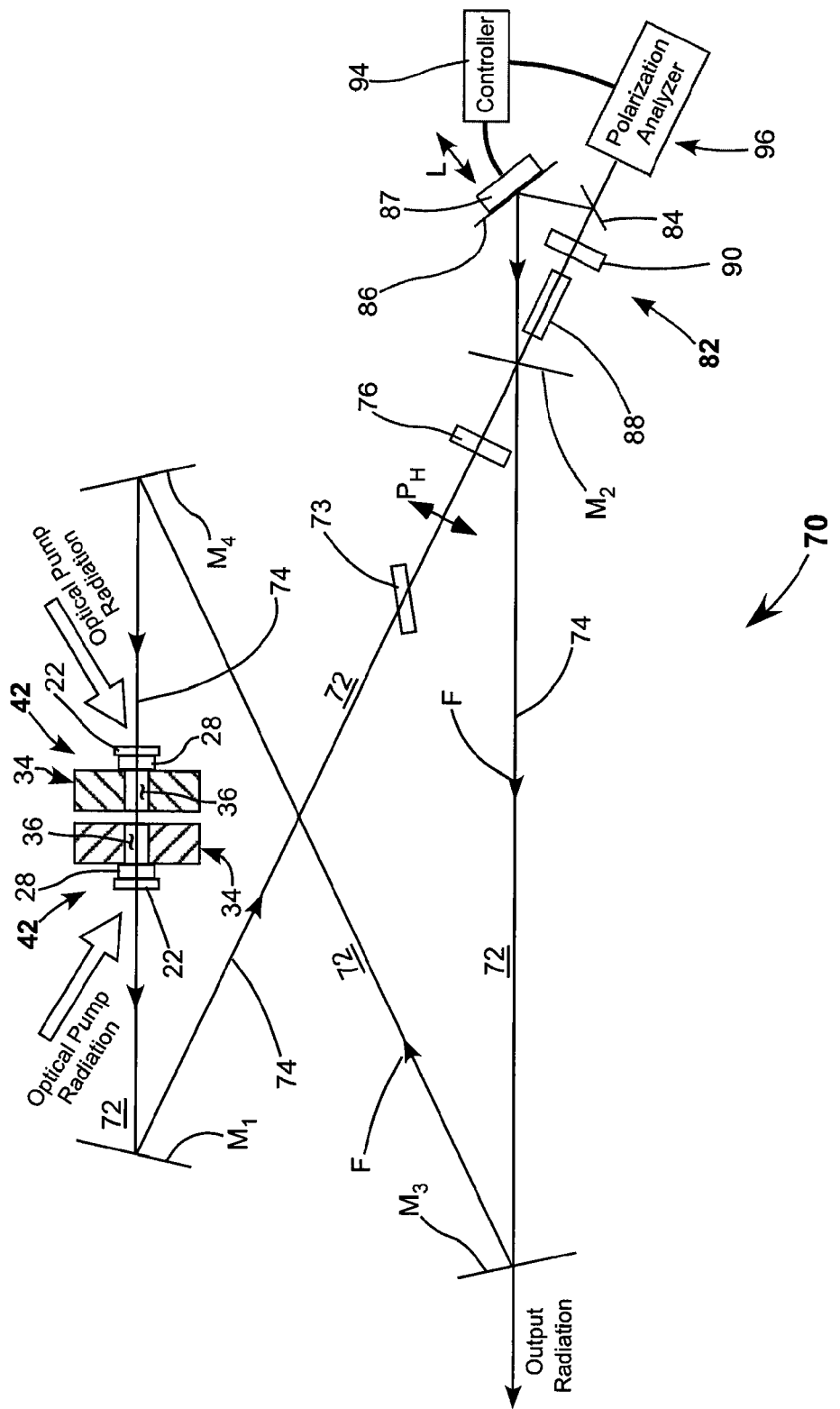
FIG. 5 schematically illustrates one preferred embodiment of an OPS-laser having a traveling-wave ring including two front-surface cooled transmissive gain-modules in accordance with the present invention, with one resonator mirror being an input/output mirror of a ring interferometer including a Faraday element which causes the effective reflectivity of the mirror to be directionally sensitive, the ring interferometer having a polarization analyzer cooperative with a controller for maintaining the interferometer in an anti-resonant condition.

FIG. 5 schematically illustrates a traveling-wave ring laser 70 including two front-cooled OPS gain-modules 42 in accordance with the present invention. Laser 70 includes a ring-resonator 72 formed by mirrors M1, M2, M3, and M4. The two gain-modules are located between mirrors M1 and M4, which are maximally reflective at wavelength of fundamental radiation F which circulates along a longitudinal axis 74 of the resonator. Mirror M3 is partially transparent at the fundamental wavelength for coupling output radiation out of the resonator.

A conventional traveling wave ring laser typically includes an optical-diode in the resonator to force unidirectional circulation. An optical-diode includes a crystal of a magneto-optic material, such as terbium gallium garnet (TGG) or an element of terbium-doped glass. The magneto-optic material (Faraday element or Faraday material) provides polarization rotation in the same direction independent of the transmission direction of radiation through the element. The element is used in the resonator in conjunction with a birefringent polarization-rotating element, the rotation direction of which is dependent on the transmission direction, and with a polarization-selective element. This provides a loss in the resonator in one direction of circulation in the resonator that is greater than that in the opposite direction, thereby forcing lasing to occur in the resonator only in the direction of circulation in which the loss is least.

Optical-diodes are most effective in a wavelength range between about 400 nanometers (nm) and 1100 nm. The effectiveness of an optical-diode depends on a so-called "Verdet" constant of the magneto-optic material. This constant defines a degree of polarization-rotation, per unit length of the material, per unit applied magnetic field. The Verdet constant for any given material is wavelength-sensitive, and typically decreases with increasing wavelength. In order to compensate for a lower Verdet constant, the path length in the magneto-optic material must be increased, which increase absorption of radiation in the material. This increases the insertion loss of the optical-diode and reduces the power-handling capability of the optical-diode due to heating caused by the absorption. Optical-diodes are commercially available that can operate at wavelengths up to about 2,000 nm, i.e., about 2.0 micrometers ($\mu$m). These, however, have an insertion (absorption) loss of about 7% or more, and, because of the absorption, can handle radiation power of only about 20 Watts (W) or less. In a resonator such as resonator circulating radiation can have a power of 100 W or greater Laser 70 is arranged such that unidirectional circulation can be achieved without having an optical diode in the resonator. This is achieved by using a ring-interferometer 82 with resonator mirror $M_2$ partially transparent at the fundamental wavelength and being an input and output mirror of the interferometer. Mirror $M_2$ is preferably about 80% reflective and 20% transmissive (absolutely) at the fundamental wavelength but has a different effective reflectivity depending on the path length of radiation in the interferometer.

Circulation in ring-interferometer 82 is completed by two further mirrors 84 and 86, and the interferometer includes a Faraday element 88 and a half-wave plate (birefringent polarization rotator) 90. Mirror 84 is about 99.5% reflective and about 0.5% transmissive for the circulating fundamental radiation. Mirror 86 is as close to 100% reflective for the fundamental wavelength as possible consistent with normal manufacturing tolerances and losses in laser mirrors. Mirror 86 is movable in and out, as indicated by double arrow L, by a piezoelectric element 87 for actively adjusting the optical length of the ring-interferometer. The resonator length is actively adjusted to keep ring-interferometer 82 in an anti-resonant condition. Element 87 is driven by a controller 94 in response to a signal for a polarization analyzer 96, a detailed description of which is presented further hereinbelow.

Continuing with reference to FIG. 5, fundamental radiation circulating in traveling-wave resonator 72 of laser 70 is plane-polarized according to the orientation of birefringent filter 73 located in the resonator. The polarization orientation is designated in FIG. 5 by double arrow $P_H$. This can be considered arbitrarily as horizontal polarization.

A polarization rotator 76, such as a half-wave plate is adjusted to slightly tilt, for example by about 1°, the polarization-orientation of the laser-radiation before the radiation is incident on mirror $M_2$ of interferometer 82. Faraday element 88 is arranged to rotate the polarization plane of radiation entering the interferometer by some larger angle, for example by about 6°. A half-wave plate 90 is adjusted to provide 6° of polarization rotation in the opposite direction to that provided by the Faraday element minus the input rotation provided by polarization rotator 76.

Figure 6:
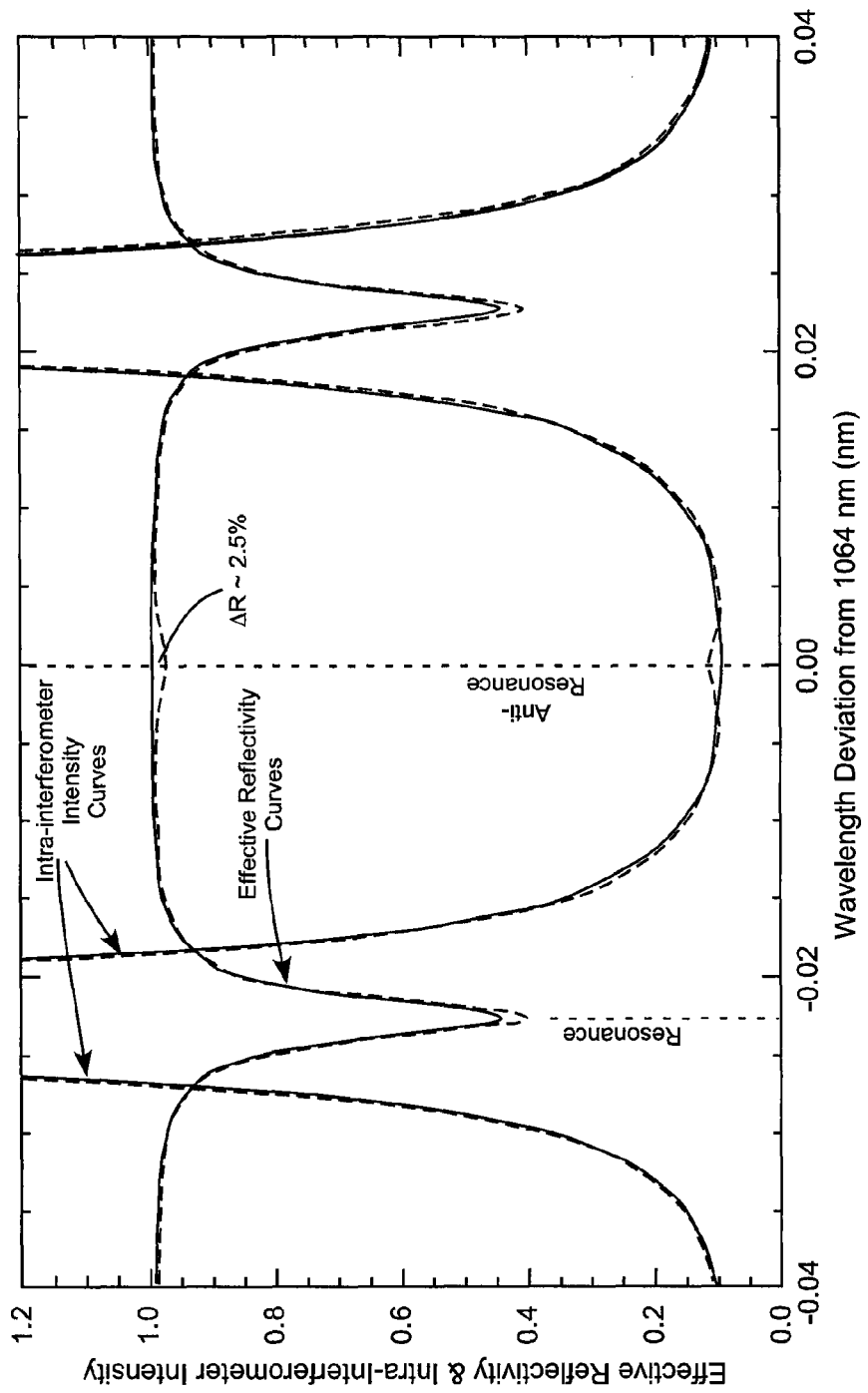
FIG. 6 is a graph schematically illustrating effective reflectivity as a function of resonator path length for two directions of circulation in the ring interferometer.

FIG. 6 schematically, graphically depicts computed effective reflectivity of mirror $M_2$ as a function of wavelength and the computed intra-interferometer intensity of radiation in ring-interferometer 82 for two directions of circulation (dotted and solid curves) in the interferometer. The intra-interferometer intensity is normalized to an input (intra-resonator) intensity of 1.0. The wavelength scale can be interpreted as the path length in the interferometer for a single fixed wavelength, 1064 nm in this instance. As the resonator length changes, the interferometer passes through resonant and anti-resonant lengths with the effective reflectivity for the two directions being different at these lengths.

It is assumed that the Faraday element is a crystal of terbium gallium garnet (TGG) and provides a polarization rotation of 6°, with polarization rotator 76 providing an input tilt of 1°. The reflectivity difference at the anti-resonant condition is about 2.5% which is sufficient to cause unidirectional circulation in resonator 72. The intra-interferometer intensity at anti-resonance for the highest reflectivity direction (solid curve) is only about 10% of the intra-resonator intensity. This provides that a Faraday element rated for only 20 Watts could be used in interferometer 82 to provide unidirectional circulation in a resonator in which 200 Watts were circulating, provided of course the interferometer were maintained in an anti-resonant condition.

In the interferometer arrangement of FIG. 5, the polarization-state of radiation sampled by polarization analyzer 96 in the desired direction will be plane at resonance and anti-resonance, and elliptical to some degree in all other states. This allows a Hänsch-Couillaud analysis to be used to actively control the path length of the interferometer. In this arrangement, the interferometer will act, additionally, as a polarization rotator, providing a net tilt on output in the opposite direction to the input tilt. This will cancel the input tilt at the output of the interferometer, so that the polarization plane, horizontal prior to tilting by external wave plate, will be horizontal again after being tilted by the interferometer.

Figure 7:
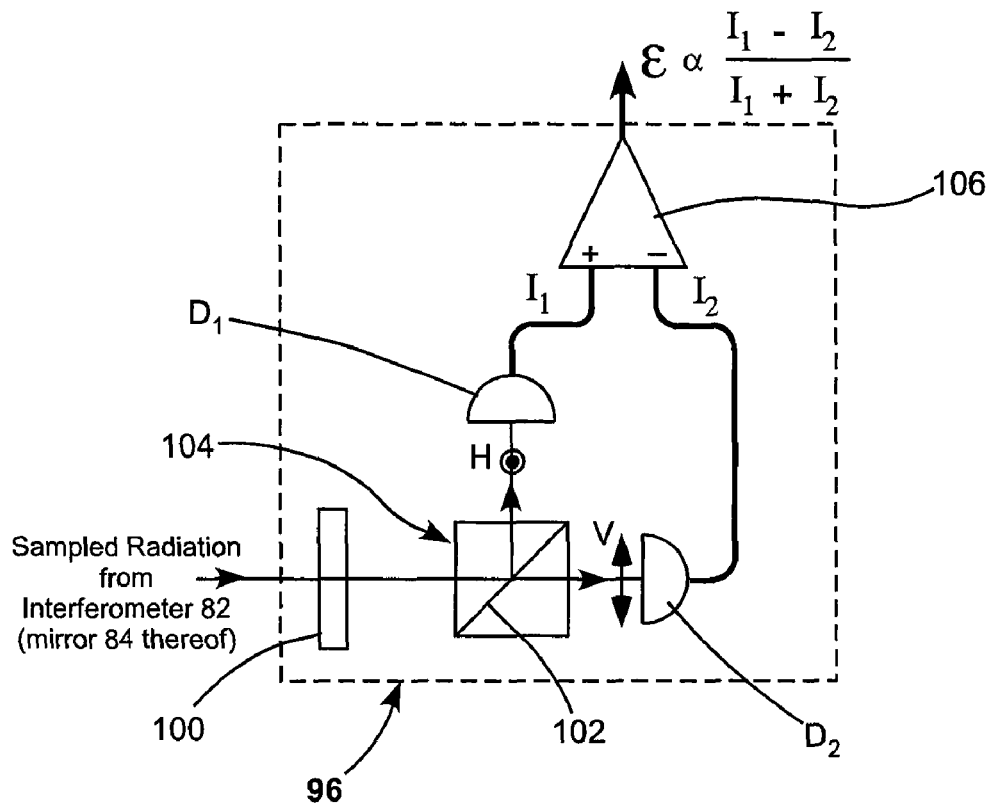
FIG. 7 schematically illustrates one preferred embodiment of the polarization analyzer and controller in the interferometer of FIG. 5.

FIG. 7 schematically illustrates one example preferred arrangement of polarization analyzer 96. Sampled radiation from mirror 84 of interferometer 82 is incident on a quarter-wave plate 100. The sampled radiation will be plane-polarized when the interferometer is in an anti-resonant (or resonant) state and elliptically polarized to some degree in any other state as noted above After transmission through plate 100, the beam sample is separated by an internal polarizing beamsplitter 102 surface of a bi-prism 104, into two plane-polarized components, with orthogonally-opposed polarization-plane orientations indicated by arrowhead H and double arrow V. Components H and V are incident on detectors $D_1$ and $D_2$ respectively. Detectors $D_1$ and $D_2$ provide signals having magnitudes $I_1$ and $I_2$, respectively, dependent on the intensities of the corresponding components H and V. Signals $I_1$ and $I_2$ are delivered to a differential amplifier 106. Differential amplifier 106 generates an error signal $\epsilon$ proportional to $(I_1-I_2)/+(I_1+I_2)$.

Figure 8:
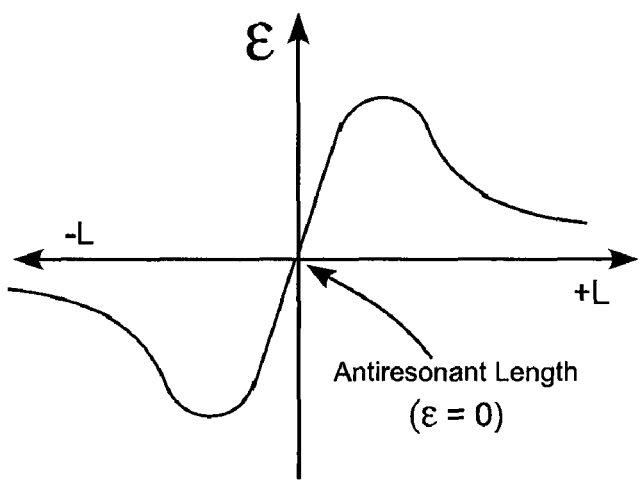
FIG. 8 is a graph schematically illustrating amplitude of a control-signal as a function of interferometer path length generated by the polarization analyzer of FIG. 7.

FIG. 8 is a graph schematically illustrating the form of signal $\epsilon$ as a function of the deviation L from an anti-resonant condition. If the sampled beam is plane-polarized before transmission through quarter-wave plate 100, i.e., if the resonator is in an anti-resonant (or resonant) condition, transmission through plate 100 will cause the sampled beam to be circularly polarized. In this case signals $I_1$ and $I_2$ will be equal, and $\epsilon$ will be zero. For all other conditions of the interferometer, the sample beam will be elliptically polarized before and after transmission through plate 100. In these conditions, $I_1$ and $I_2$ will be unequal, and $\epsilon$ will be non-zero with a sign dependent on which side of the anti-resonant condition the interferometer is at. Signal $\epsilon$ is fed to controller 94 (see FIG. 5) which adjusts piezoelectric element 87 to drive epsilon back to zero and maintain the interferometer at anti-resonance as discussed above.

It should be noted here that ring-interferometer and control apparatus therefor is but one possible arrangement of such an interferometer. This and other arrangements and computations are described in detail in U.S. patent application Ser. No. 12/235,790, filed Sep. 23, 2008, by Austin and Caprara, assigned to the assignee of the present invention, and the complete disclosure of which is hereby incorporated by reference.

The transmissive gain-module 42 solves the above described problem of including more than one conventional OPS-chip in a resonator. Even if there is some change in shape of either gain-structure 22, the resulting beam deflection will be negligible and the pump-radiation will stay aligned with the circulating fundamental radiation at both gain-structures. An advantage of using gain-structures in a traveling wave resonator rather than a standing-wave resonator is that gain-providing active (quantum-well) layers need not be spaced by one half wavelength (a fundamental wavelength) of the standing wave. This provides that as many as five-times more active layers, spaced by equally thin barrier layers may be included in the gain-structure with the gain-structure having less total thickness than the half-wave spaced structure, and accordingly being more easily cooled. A disadvantage compared with use in a standing wave resonator, is that resonant enhancement of electric-field at individual quantum-well layers is lost.

It is important to make sure that the total optical thickness of the gain-structure is some whole number of half-waves at the fundamental wavelength in order to maximize transmission of the structure. The thickness of the diamond spreader will be sufficient that it will be an integer number of half wavelengths optical thickness at one or more wavelengths within the gain-bandwidth of the gain-structure The pump-radiation, preferably has a wavelength selected that it absorbed by the active layers.

This arrangement is particularly suitable for so called broken-gap or W-structures wherein a gain providing superlattice comprises a "hole" quantum-well layer between two "electron" quantum-well layers. A plurality of such superlattices may be included in a gain element 22, without half-wave spacing therebetween. One example of such a superlattice is a superlattice of indium gallium antimonide ($In_xGa_{(1-x)}Sb$) and indium arsenide (InAs) 124. This combination of layers has an effective bandgap intermediate those of GaInSb materials due to strain and very thin nature of the layers (much less than a DeBroglie wavelength). In effect, radiative recombination occurs when electrons in the conduction band of the GaInSb material recombine with holes in valence band of the InAs material. For $In_xGa_{(1-x)}Sb$ with a value of x equal to 0.75 and with thicknesses of the $In_xGa_{(1-x)}Sb$ and InAs layers of 28 Å and 7 Å respectively, the element would have a peak gain wavelength of about 2.1 μm. A suitable wavelength for pump-radiation is 980 nm.

The $In_xGa_{(1-x)}Sb$/InAs broken gap structure is only one example of a broken-gap structure that is useful in gain-structure 22 in a transmissive gain-module 42. Any other such structure may be used without departing from the spirit and scope of the present invention.

In summary, the present invention is described above in terms of a preferred and other embodiments. The invention is not limited, however, to the embodiments described herein. Rather, the invention is limited only by the claims appended hereto.

What is claimed is:

1. Laser apparatus comprising,:
   a laser-resonator formed by a plurality of resonator mirrors;
   an epitaxially grown semiconductor multilayer gain-structure, the gain-structure having first and second surfaces and including a plurality of active layers spaced apart by barrier layers and being located in the laser-resonator, wherein all of the resonator mirrors are spaced from the gain structure;
   a diamond heat-spreader having first and second opposite surfaces, the first surface of the diamond heat-spreader being bonded to the second surface of the gain-structure;
   an arrangement for delivering optical pump-radiation having a pump-radiation wavelength to the gain-structure such that a portion of the pump-radiation energizes the gain-structure and generates fundamental-wavelength laser-radiation which circulates in the laser-resonator, with a residual portion of the pump-radiation being converted to heat in the gain-structure;
   a heat-sink member in thermal contact only with the second surface of the diamond heat-spreader, the heat-sink member including an aperture and being configured such that heat is removed from the gain-structure only via the second surface of the gain-structure and the diamond heat-spreader, while allowing access, via said aperture, to the energized gain-structure by the laser radiation circulating in the laser-resonator; and
   wherein there is no arrangement for extracting heat from the gain-structure via the first surface thereof and wherein the gain structure, heat spreader and heat-sink member define a transmissive path to allow the fundamental radiation to circulate in the resonator.

2. The apparatus of claim 1, wherein the resonator is a traveling-wave ring-resonator.

3. The apparatus of claim 1 further including second multilayer gain structure, a second heat spreader connected to one side of the second gain structure and a second heat-sink connected to the second heat spreader and having an aperture therein, with the second gain structure, second heat spreader and second heat sink being located within the resonator and being transmissive to the fundamental radiation.

4. Laser apparatus comprising:
   a laser-resonator formed by a plurality of resonator mirrors;
   at least a first epitaxially grown semiconductor multilayer gain-structure, the gain-structure having first and second surfaces and including a plurality of active layers spaced apart by barrier layers and being arranged as a transmissive gain-element in the resonator; and
   an arrangement for delivering optical pump-radiation having a pump-radiation wavelength to the gain-structure such that a portion of the pump-radiation energizes the gain-structure and generates fundamental-wavelength laser-radiation which circulates in the laser-resonator through the gain-structure, and wherein the laser-resonator is a traveling wave ring-resonator and the laser-radiation circulates in the laser-resonator unidirectionally through the first gain-structure and further including a second epitaxially grown semiconductor multilayer gain-structure and being arranged as a transmissive gain-element in the resonator, and wherein all of the resonator mirrors are spaced from the gain structures and the gain structures define a transmissive path allowing the laser-radiation to circulate in the laser-resonator unidirectionally through the first and second gain-structures.

5. The apparatus of claim 4, wherein the gain-structure has first and second opposite surfaces and the apparatus further includes a diamond heat-spreader and a heat-sink arrangement, the diamond heat-spreader having first and second opposite surfaces, the first surface of the diamond heat-spreader being bonded to the second surface of the gain-structure, and the heat-sink arrangement being bonded to the diamond heat sink arrangement and configured to allow access to the gain-structure by the laser-radiation circulating in the laser-resonator.

6. The apparatus of claim 5, wherein said heat sink arrangement includes an aperture for allow access to the gain-structure by the laser-radiation circulating in the laser-resonator.

* * * * *